US008362932B2

(12) United States Patent
Pavlovic et al.

(10) Patent No.: US 8,362,932 B2
(45) Date of Patent: Jan. 29, 2013

(54) CIRCUIT WITH A TIME TO DIGITAL CONVERTER AND PHASE MEASURING METHOD

(75) Inventors: Nenad Pavlovic, PC Eindhoven (NL); Manel Collados Asensio, GA Eindhoven (NL); Xin He, AE Waalre (NL); Jan Van Sinderen, SB Liempde (NL)

(73) Assignee: ST-Ericsson SA, Plan-les-Ouates (CH)

( * ) Notice: Subject to any disclaimer, the term of this patent is extended or adjusted under 35 U.S.C. 154(b) by 75 days.

(21) Appl. No.: 13/000,732

(22) PCT Filed: Jun. 30, 2009

(86) PCT No.: PCT/EP2009/058201
§ 371 (c)(1),
(2), (4) Date: Mar. 18, 2011

(87) PCT Pub. No.: WO2010/000746
PCT Pub. Date: Jan. 7, 2010

(65) Prior Publication Data
US 2012/0019296 A1 Jan. 26, 2012

(30) Foreign Application Priority Data

Jul. 2, 2008 (EP) .................................. 08159474

(51) Int. Cl.
*H03M 1/48* (2006.01)

(52) U.S. Cl. ........ 341/111; 327/158; 327/107; 327/117; 327/265; 327/285; 331/1 A; 331/25; 331/34; 375/219; 375/259; 375/316; 375/376

(58) Field of Classification Search .................. 327/158, 327/156, 8, 159, 265, 285, 160, 107, 115, 327/117; 331/1 A, 25, 34; 375/219, 259, 375/316, 376; 341/120–155
See application file for complete search history.

(56) References Cited

U.S. PATENT DOCUMENTS

| | | | |
|---|---|---|---|
| 1,999,707 A * | 4/1935 | Spiegel | 24/265 WS |
| 6,429,693 B1 | 8/2002 | Staszewski et al. | |
| 6,754,613 B2 * | 6/2004 | Tabatabaei et al. | 702/189 |
| 7,570,182 B2 * | 8/2009 | Sheba et al. | 341/118 |
| 7,928,888 B1 * | 4/2011 | Chiu et al. | 341/161 |

(Continued)

OTHER PUBLICATIONS

International Search Report for PCT/EP2009/058201 mailed Oct. 14, 2009.

(Continued)

*Primary Examiner* — Lam T Mai
(74) *Attorney, Agent, or Firm* — Potomac Patent Group PLLC

(57) ABSTRACT

Calibration data for calibrating time to digital conversion is obtained by switching a feed circuit of a time to digital converter between a normal operating mode or a calibration mode. A delay circuit with a delay circuit input and a plurality of taps outputs. A sampling register samples data from the data inputs. The feed circuit provides for selection of transitions of the oscillator signal that control timing of a first active transition at the clock circuit after a transition at the delay circuit input. A control circuit switches the feed circuit between normal operating mode and calibration mode, and controls the feed circuit successively to select a plurality of different transitions to control timing of the first active transition in the calibration mode. The control circuit reads out resulting data from the sampling register for each selection and determines calibration data for the oscillator signal from said data.

7 Claims, 3 Drawing Sheets

U.S. PATENT DOCUMENTS

| | | | |
|---|---|---|---|
| 7,932,847 B1 * | 4/2011 | Hsieh et al. | 341/155 |
| 7,978,111 B2 * | 7/2011 | Sun et al. | 341/155 |
| 8,023,363 B2 * | 9/2011 | Huang et al. | 368/118 |
| 8,072,631 B2 * | 12/2011 | Murai et al. | 358/1.15 |
| 8,106,808 B1 * | 1/2012 | Cohen et al. | 341/166 |
| 8,138,958 B2 * | 3/2012 | Dai et al. | 341/155 |
| 8,164,493 B2 * | 4/2012 | Hsieh | 341/110 |
| 8,174,293 B2 * | 5/2012 | Yoshihara et al. | 327/107 |
| 8,228,219 B2 * | 7/2012 | Henzler et al. | 341/120 |
| 2005/0001656 A1 | 1/2005 | Chou | |
| 2006/0103566 A1 | 5/2006 | Vemulapalli et al. | |
| 2008/0048791 A1 | 2/2008 | Fahim | |

OTHER PUBLICATIONS

Written Opinion for PCT/EP2009/058201 mailed Oct. 14, 2009.

* cited by examiner

CIRCUIT WITH A TIME TO DIGITAL CONVERTER AND PHASE MEASURING METHOD

FIELD OF THE INVENTION

The invention relates to a circuit comprising a fractional phase detector and to a method of calibrating such a fractional phase detector.

BACKGROUND OF THE INVENTION

A digital phase lock loop (DPLL) uses a phase detector to detect a phase difference between a reference signal and a digital controlled oscillator signal. If the edges of digital oscillator (DO) signal are counted the phase of the DO is quantized with accuracy of one DO period. The reference counter accumulates, at every reference clock cycle, a tuning word that express the channel in the units of the reference frequency. In this way the reference counter defines the time points where the DO should be. The phase detector measures the difference between two counters and produced correction signal for the loop.

U.S. Pat. No. 6,429,693 discloses a fractional phase detector that provides for a more refined measurement of phase difference, with an accuracy corresponding to a fraction of the clock period. This may be realized by using a chain of delay circuits to generate successively more delayed versions of the clock signal and sampling these versions at the time of a transition of the reference signal. The delays differ by fractions of the signal periods. From the sampling result the time delay between the clock signal and the reference signal can be determined, expressed in terms of the time delays of the delay circuits. This type of operation is called time to digital conversion (TDC).

Unfortunately, a TDC measures time rather than phase. U.S. Pat. No. 6,429,693 mentions that to convert the measured time into phase, the delay has to be divided by the length of the period of the clock signal, also expressed in terms of the delays of the delay circuits. U.S. Pat. No. 6,429,693 avoids performing this conversion, because it only uses the time measurement as an error signal. However, U.S. Pat. No. 6,429,693 illustrates a phase computation wherein time delays are determined between the transition of the reference signal and both a positive and a negative transition of the clock signal, each in terms of time delays of the delay circuit. The difference between the two time delays represents the time interval between the positive and negative transitions of the clock signal. This difference is used to normalize a time measurement between a transition of the clock signal and the transition of the reference signal. Thus, a phase value is obtained. However, this method may not produce useful result when the period of the reference signal is an integer multiple of the clock signal. Also, different reaction times of the delay line to logical up-down and down-up transitions may affect accuracy.

SUMMARY OF THE INVENTION

Among others, it is an object to provide for a calibrated fractional phase measurement.

A circuit comprising a time to digital converter and an oscillator circuit having an oscillator coupled to the time to digital converter, as claimed in claim 1 is provided for. Herein a calibration mode is used, wherein signals with transitions having timing controlled by an oscillator signal to both the input of a delay circuit and a clock input of a sampling register coupled to taps of the delay circuit. A plurality of different transitions of the oscillator signal is selected to control timing of a first active transition at the clock circuit after a transition at the delay circuit input. Resulting data is read from the sampling register for each selection and calibration data for the oscillator signal is determined from the data for the plurality of different transitions. In this way influences of unknown delays may be eliminated. The calibration data may be used for example to control a relative calibration of a less significant part of the phase obtained by the time to digital converter and a more significant part obtained for example by counting periods of the oscillator signal.

In an embodiment the oscillator circuit and the time to digital converter are part of a phase locked loop that also comprises a phase detector that use both the less significant part and the more significant part, calibrated relative to each other to generate a frequency control signal for the oscillator. Thus, jitter due to inaccurate relative calibration may be reduced. In an alternative embodiment a phase demodulation circuit may be realized using such a phase detector, also without a phase locked loop. The calibration data may be programmed programmable translation circuit coupled between the taps and the phase detector. In this way, fast calibration may be realized.

In an embodiment, a polarity selection circuit may be used, configured to select a polarity of a transition in the oscillator signal that controls timing of the first active transition at which the sampling register samples the data from the delay circuit. In this way a fast calibration is made possible.

In an embodiment the feed circuit comprises a pulse suppression circuit, configured to select the transition of the oscillator signal that controls timing sampling after a selectable number of pulses subsequently in the oscillator signal. In this way duty cycle dependence of the calibration may be avoided.

BRIEF DESCRIPTION OF THE DRAWINGS

These and other objects and advantageous aspects will become apparent from a description of exemplary embodiments, using the following Figures

DETAILED DESCRIPTION OF EXEMPLARY EMBODIMENTS

Figure 1:
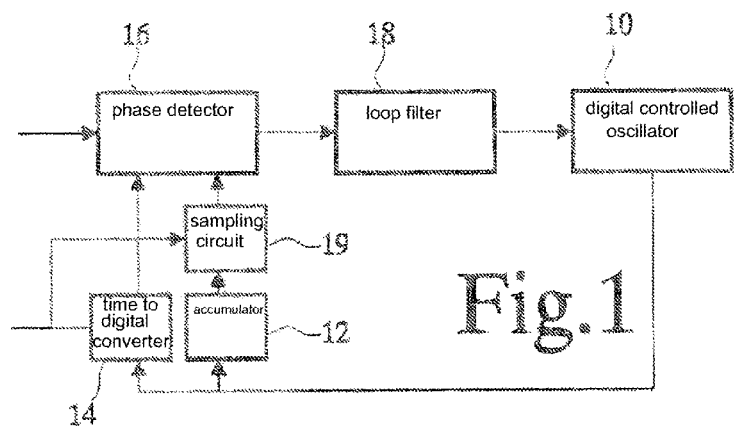
FIG. 1 shows a digital phase locked loop

FIG. 1 shows a digital phase locked loop. The phase locked loop comprises a digital controlled oscillator 10, an accumulator 12, a time to digital converter 14, a phase detector 16, a loop filter 18 and a retimed sampling circuit 19. Phase detector 16 has a first, second and third input for a reference signal, an accumulated oscillator phase signal and a fractional phase signal respectively. An output of phase detector 16 is coupled to a control input of digital controlled oscillator 10 via loop filter 18. Digital controlled oscillator 10 has an output coupled to the second and third input of phase detector 16 via an accumulator 12, and time to digital converter 14, respectively. Sampling circuit 19 is coupled between accumulator 12 and phase detector 16.

In operation the frequency (i.e. phase increment speed) of digital controlled oscillator 10 is controlled in a feed back loop. The phase of the output signal of digital controlled oscillator 10 is compared to a reference and the result of the comparison is used to control adaptation of the frequency of digital controlled oscillator 10. The most significant part of the phase of digital controlled oscillator 10 is defined by accumulated values in accumulator 12.

The reference is represented by first and second reference signals. The first reference signal is applied to the first input of the phase detector 16. The reference signal and the accumulated values may both comprise an integer part representing a count of cycles. Optionally they may contain a fractional part as well. The second reference signal is applied to sampling circuit 19 and to time to digital converter 14. The second reference signal indicates when samples of accumulated values from accumulator 12 must be sampled. The timing of the second reference signal also defines the least significant part of the phase of the reference relative to the output signal of digital controlled oscillator circuit 10. Time to digital converter 14 produces a measurement of the least significant part of the phase difference between the reference and the digital controlled oscillator 10.

Phase detector 16 determines the most significant part of the phase difference from the sample value from the accumulator and the first reference signal and combines it with the least significant part. Phase detector 16 applies the resulting phase difference signal to the frequency control input of digital controlled oscillator 10 via loop filter 18, so that the frequency and phase of digital controlled oscillator 10 is locked to the reference.

Accumulator 12, phase detector 16 and loop filter 18 may be digital signal processing circuits, or they may be implemented using a digital signal processor programmed to perform their respective functions. Similarly, digital controlled oscillator 10 may be partly implemented as a signal processing circuit. These signal processing circuits may operate under control of a clock signal, updating signal values each time at the start of successive clock cycles.

The second reference signal need not be synchronous to this clock signal since the accumulated values from accumulator 12 are sampled under control of the second reference signal sampling circuit 19 which may be constructed to avoid timing problems. In an embodiment, the sampling circuit 19 comprises a synchronous sampling circuit and a clock retimer circuit of a type that is known per se. The clock retimer circuit receives the second reference signal and the output signal of digital controlled oscillator and it is configured to generate signal transitions at time points defined by the output signal of digital controlled oscillator, when enabled by a preceding transition of the second reference signal. The synchronous sampling circuit is coupled between accumulator 12 and phase detector 16, with a clock input coupled to an output of the clock retimer circuit. Thus the synchronous sampling circuit operates in the clock domain of the other signal processing circuits.

Figure 2:
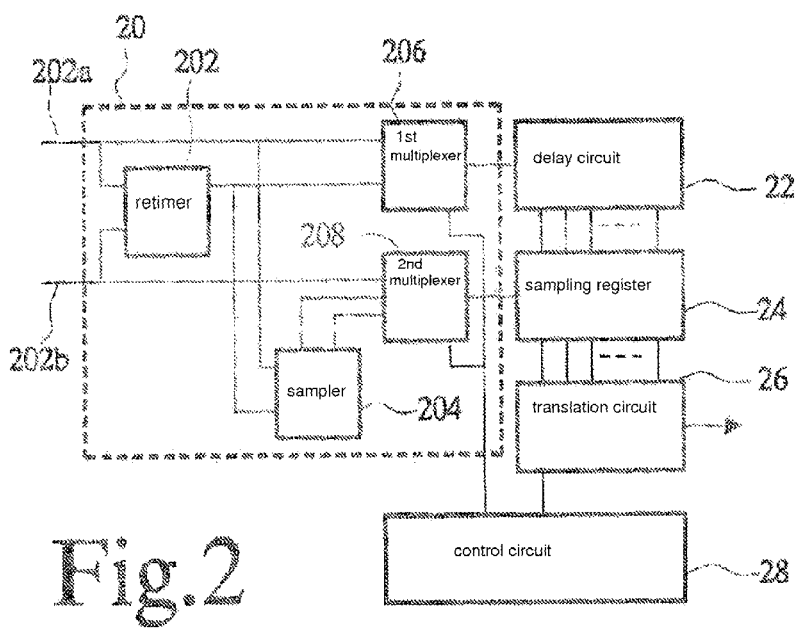
FIG. 2 shows a time to digital conversion circuit

FIG. 2 shows a time to digital converter, comprising a feed circuit 20, a delay circuit 22, a sampling register 24, a translation circuit 26 and a control circuit 28. Feed circuit 20 has a first output coupled to delay circuit 22. In an embodiment delay circuit comprises a chain of delay elements with mutually equal delay, such as inverters, or pairs of successive inverters, with taps coupled to nodes between the delay elements. However, equal delays are not indispensible, as translation circuit 26 may correct for unequal delays. Alternatively, a number of delay elements may be used in parallel with mutually different delays and taps at their outputs. As will be appreciated, delay circuit 22 may also amplify the delayed signal, invert it, threshold it etc. As used herein a delay circuit is a circuit that delays logic level transitions without excluding other changes of the signal.

Sampling register 24 has data inputs coupled to the taps of delay circuit 22 and a clock input coupled to a second output of feed circuit 20. Sampling register 24 has an output coupled to the output of the time to digital converter via translation circuit 26 and to control circuit 28 (the latter not explicitly shown). Control circuit 28 has control outputs coupled to feed circuit 20 and to translation circuit 26.

Feed circuit 20 comprises a retimer 202, a sampler 204 and a first and second multiplexer 206, 208. Feed circuit has a first and second input 200a, b for a digital clock signal and a reference signal respectively. The first input 200a is coupled to clock inputs of retimer 202 and sampler 204. An output of retimer 202 is coupled to a data input of sampler 204. Sampler 204 has a first and second output for sampled signals and their logical inverse respectively.

First and second multiplexers 206, 208 have an output coupled to the input of delay circuit 22 and the clock input of sampling register 24 respectively. First and second multiplexers 206, 208 have control inputs coupled to control circuit 28. First multiplexer 206 has inputs coupled to first input 200a and to an output of retimer 202. Second multiplexer 208 has inputs coupled to second input 200b and to the outputs of sampler 204. In operation, control circuit 28 switches the time to digital converter between a normal operating mode and a calibration mode. In the normal operating mode control circuit 28 controls multiplexers 206, 208 to pass the signals from first and second inputs 200a, b respectively. As a result the signal from digital controlled oscillator 10, which arrives at first input 200a, is passed to delay circuit 22 and the reference signal, which arrives at second input 200b, is passed to the clock input of sampling register 24. The signal from digital controlled oscillator 10 may be a binary signal. Delay circuit 22 produces variously delayed versions of this signal. Sampling register 24 samples variously delayed versions of the signal from digital controlled oscillator 10 at time points defined by the reference signal. Translation circuit 26 translates the sampled signals into least significant phase difference values, which it applies to phase detector 16. Translation circuit 26 is a programmable circuit, for example a look-up memory, which provides for a programmable translation of sample values into phase difference values.

Control circuit 28 is configured to program the translation based on results obtained in the calibration mode. To obtain these results control circuit 28 may periodically switch the time to digital converter to the calibration mode. In the calibration mode, control circuit 28 controls first multiplexer 206 to pass the signal from retimer 202 to the input of delay circuit 22. Similarly, in the calibration mode control circuit 28 controls second multiplexer 208 to pass a signal from sampler 204 to the clock input of sampling register 24. The calibration modes has two stages that differ in the selection of the output of sampler 204 that is coupled to the clock input of sampling register 24. In the first and second stage second multiplexer 208 couples the clock input of sampling registers 24 to the first and second output of sampler 204 respectively. As a result mutually inverse clock signals will be used in the respective stages.

Figure 3:
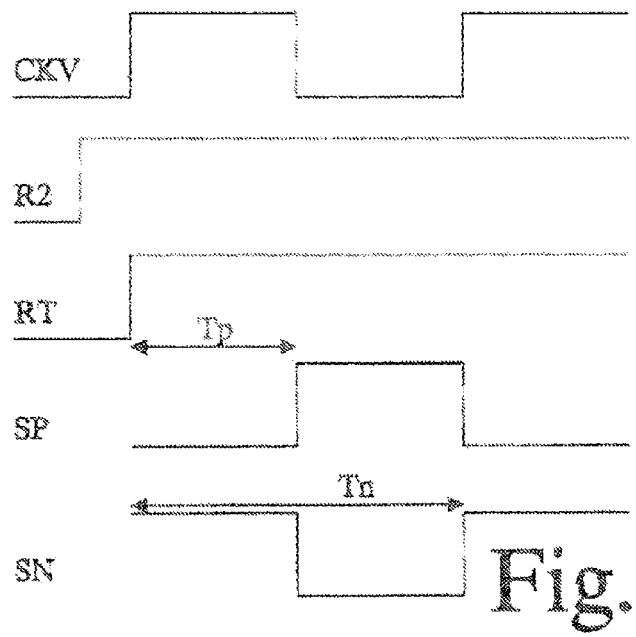
FIG. 3 shows signals involved in calibration

FIG. 3 show the signals in the first and second stage. A first trace shows the signal CKV from digital controlled oscillator 10, a second trace shows the second reference signal R2, a third trace shows the retimed signal RT from retimer 202 that is applied to delay circuit 22. A fourth and fifth trace show the output signals SP, SN of sampler 204 that are applied to the clock input of sampling registers 24 in the first and second calibration stage respectively.

In the illustrated embodiment the first positive transition in the signals SP, SN from sampler 204 trigger sampling by sampling register 24. The transition that triggers sampling will be termed the first active transition. Of course, the positive transition is an example: instead of being response to a positive clock signal transitions sampling register 24 may be responsive to a negative transition, in which case this will be called the active transition.

Controlled timing of the first active transition dependent on the output signal of digital controlled oscillator 10 is used in calibration. Feed circuit 20 ensures that in the different calibration stages the timing of this first positive transition is controlled by mutually different transitions of the output signal of digital controlled oscillator 10 (different, that is, in their relative position with respect to the last preceding transition of retimed signal RT). In the embodiment of FIG. 3 the first active transition is timed by transition of positive and negative polarity in the output signal of digital controlled oscillator 10 in the different stages respectively.

The first active transition may be generated in various ways. Although FIG. 3 shows that this first positive transition may be preceded by a negative transition which does not trigger sampling, it should be understood that alternatively signals without previous negative transition may be used. This may be realized by using a plurality of sampling circuits, responsive to logically mutually inverse versions of the output signal of retimer 202. In another embodiment, instead of coupling multiplexer 208 to mutually inverse outputs of sampler 204, a single output of sampler 204 is coupled to a first input of an exclusive OR gate, a second input of the exclusive OR gate being coupled to control circuit 28 and an output of an exclusive OR gate being coupled to second multiplexer 208. In this way, control circuit may control inversion via the exclusive OR gate. Alternatively other polarity selection circuits may be used that selectably cause different transitions in the output signal of digital controlled oscillator 10 to determine the timing of the first active transition at the clock input of sampling register 24.

During calibration control circuit 28 receives sampled output signals from sampling register 24. These signals stem from respective taps of delay circuit 22 and indicate whether, at the time of the first rising transition of the output signals SP, SN, the last transition of the retimed signal RT occurred further in the past than the delay associated with the tap. By determining the boundary between the taps for which this is the case and the taps for which this is not the case, the control circuit 28 may obtain quantized estimates of the lengths Tp, Tn of the time intervals between the last transition of the retimed signal RT and the transitions of the output signals SP, SN of sampler 204.

For these lengths the following equations hold:

$$Tn = Tcvk - To$$

$$Tp = Tcvk/2 - To$$

Herein Tcvk is the period of the output signal from digital controlled oscillator 10 and To is an unknown delay due to multiplexers 206, 208, sampler 204, and internal circuits of delay circuit 22 and sampling register 24. From these relations an expression for Tcvk can be derived:

$$Tcvk = 2*(Tn - Tp)$$

In the calibration mode control circuit 28 sets second multiplexer 208 to pass signals from the first and second output of sampler 204 and reads out signals from sampling register 24, after the different settings. Accordingly, these signals represent the quantized estimates of the lengths Tp, Tn. Subsequently control circuit 28 computes Tcvk from the quantized estimates of the lengths Tp, Tn, consistent with the expression for Tcvk in terms of Tp and Tn. From the computed Tcvk control circuit 128 determines the phase values (time values normalized by Tcvk) associated with the output signals of sampling register 24 that are possible in the normal operating mode, and programs translation circuit 26 to translate these output signals into the phase values that have been determined.

When delay circuit 22 defines equidistant delays, the translation may be programmed using a single calibration factor. When the delays may be unequal, corrected values may be provided in a look-up table for each possible read out. In addition, control circuit 28 may determine the unknown delay To from these measurements and use it to control an offset in the translation of sampled values to phase values.

Figure 4:
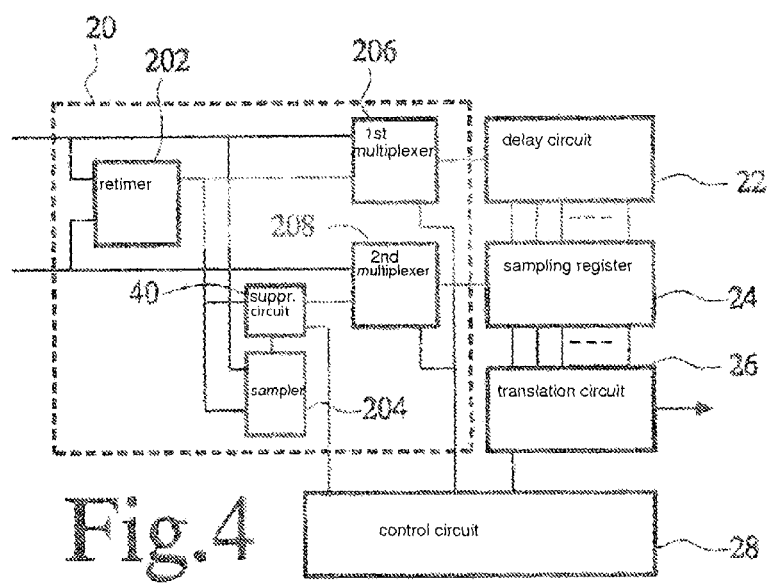
FIGS. 4, 5 show time to digital conversion circuits

FIG. 4 shows an embodiment wherein a pulse suppression circuit 40 has been added between an output of sampler 204 and the input of second multiplexer 208. This pulse suppression circuit has a reset input coupled to the output of retimer 202. The pulse suppression circuit is configured to disable a number of pulses (e.g. one pulse) of the signal from the second output after a transition of the output of retimer 202. Pulse suppression circuits are known per se. A pulse suppression circuit may comprise a counter and an AND gate. The counter may be coupled to a pulse input, to count pulses after a reset from retimer 202. The AND gate may have inputs coupled to the pulse input and an overflow output of the counter.

The use of a pulse suppression circuit has the effect that the measured delay corresponds to $$Tn(k) = k*Tcvk - To$$

Here k is the number of suppressed pulses. Accordingly when two delays Tn(k), Tn(k') are measured, with different numbers k, k' of suppressed pulses (one of which may be zero)

$$Tcvk = (k - k')*(Tn(k) - Tn(k'))$$

Control circuit 28 may successively set pulse suppression circuit 40 to suppress different numbers of pulses k, k' (one of which may be zero) and read out signals from sampling register 24, using these settings. These signals represent the quantized estimates of the lengths Tn(k), Tn(k'). Subsequently control circuit 28 computes Tcvk from the quantized estimates of the lengths Tn(k), Tn(k'), determines the phase values and programs translation circuit 26 to translate the output signals of sampling register 24 into the phase values. In this way it is possible to void duty cycle dependence.

The embodiment of FIG. 4 may be combined with that of FIG. 2, for example by using a pulse suppression circuit between one or both of the outputs of sampler 204 and second multiplexer 208, or between second multiplexer 208 and the clock input of sampling register 24. As will be appreciated, any combination of tap data obtained by sampling at time points controlled by a plurality of differently selected transitions of the output signal of digital controlled oscillator 10 may be used. Two differently selected transitions suffice. By subtracting the delays represented by the different resulting tap signals from delay circuit 22 the common unknown delay may be eliminated.

Figure 5:
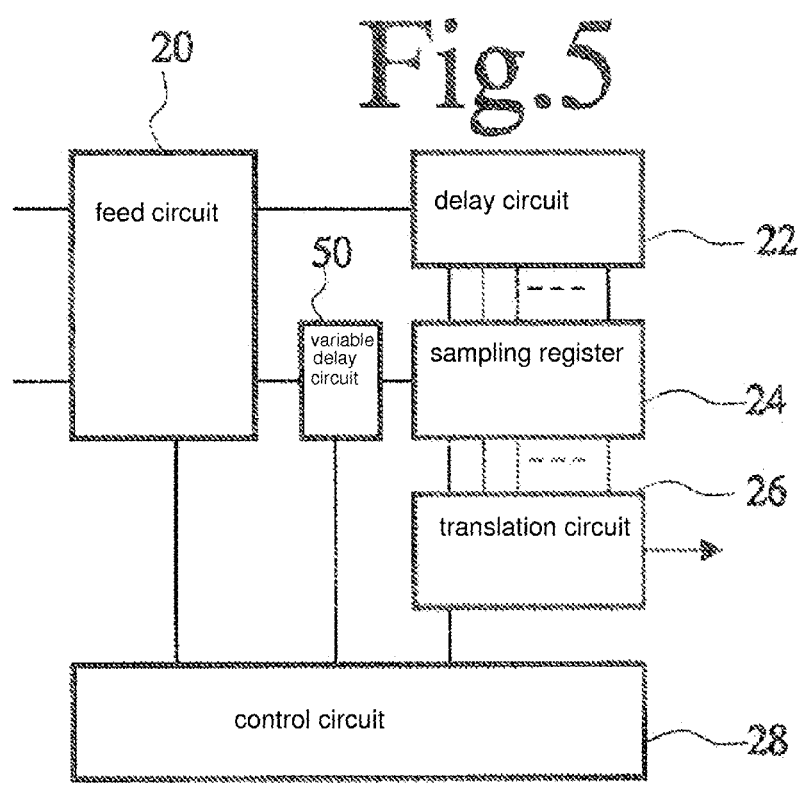

FIG. 5 shows an embodiment wherein a variable delay circuit 50 has been added between feed circuit 20 and the clock input of sampling register 24. In operation variable delay circuit 50 is used to dither the measurements. That is, control circuit 28 may control variable delay circuit 50 to apply randomly varying delays that are not quantized as the delays of delay circuit 22. Subsequently control circuit averages the resulting quantized delay measurements Tn and/or To obtain more accurate delay measurements. Instead of random variations of the delay, the delay may be ramped up or down or varied in any other way. Dithering may also be used during normal operation, to obtain more accurate measurements, in which case control circuit 28 is preferably configured to vary the delay at frequencies outside the pass-band of loop filter 18.

When the period of digital controlled oscillator 10 is only varied by a small amount the calibration mode need not be performed very often. Basically, a single calibration may suffice for a single frequency. Alternatively periodic calibrations may be performed. In an embodiment, translation circuit 26 may be configured to freeze its output in the calibration mode to a last phase value obtained in the normal operation mode.

Although a specific embodiment has been described it should be understood that other embodiments are possible. For example, instead of using the second reference signal as input for feed circuit 20 in the calibration mode, any other signal may be used, or this signal may be dispensed with by triggering a pulse sequence as shown in FIG. 3 in response to a signal from control circuit 28.

Similarly, instead of using different signals at the clock input of sampling register 24 in the calibration mode, different signals may be applied to the delay circuit 22. Accurate calibration of phase measurements may be performed when the relative delay between the signals at the clock input and sampling register 24 and the input of delay circuit 22 is varied by amounts defined by the period or half period of the output signal of digital controlled oscillator 10.

Control circuit 28 may be implemented using a programmable computer programmed to perform its function. The programmable computer may also be programmed to perform the functions of accumulator 12, phase detector 16, loop filter 18, translation circuit 26 etc.

Instead of using a translation circuit in the time to digital conversion circuit, phase detector 16 may be configured to use information about the oscillator period in terms of delays of delay circuit 22 to control the way in which the more significant part of the phase information is combined with the data obtained by sampling the taps of delay circuit 22. For example, instead of converting time into phase, the information about the oscillator period may be used to convert phase into time. Instead of using the same sampling register both in the calibration mode and the normal operating mode to read delay circuit 22, different sampling registers may be used for this read out in the different modes.

Although an embodiment has been described wherein the time to digital converter is used in a phase locked loop, it should be appreciated that other applications are possible, for example in a digital phase demodulator, wherein the phase difference between digital controlled oscillator 10 and a reference signal is measured without necessarily adapting any frequency, or in a phase locked loop wherein the phase detector is used to control the frequency of a source circuit of the reference signal instead of that of digital controlled oscillator 10.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A circuit comprising a time to digital converter (14) and an oscillator circuit having an oscillator (10) coupled to the time to digital converter (14), the time to digital converter (14) comprising:
   a delay circuit (22) with a delay circuit input and a plurality of taps, the delay circuit (22) being configured to output respective, differently delayed versions of a signal from the delay circuit input at said taps;
   a sampling register (24) with a clock input and data inputs coupled to the taps, configured to sample data from the data inputs in response to an active transition at the clock input;
   a feed circuit (20) coupled to the oscillator output, the delay circuit input and the clock input, configured to operate selectably at least in a normal operating mode or a calibration mode, and configured, when in the normal operating mode, to feed an oscillator signal of the oscillator circuit (10) to the delay circuit input and a reference signal to the clock input of the sampling register (24), and, when in the calibration mode, to supply signals with transitions having timing controlled by the oscillator signal to both the delay circuit input and the clock input, the feed circuit (20) being configured to provide for selection of transitions of the oscillator signal that control timing of a first active transition at the clock circuit after a transition at the delay circuit input; and
   a control circuit (28) configured to switch the feed circuit between the normal operating mode and the calibration mode, to control the feed circuit (20) successively to select a plurality of different transitions to control timing of the first active transition in the calibration mode, to read out resulting data from the sampling register (24) for each selection and to determine calibration data for the oscillator signal from said data.

2. A circuit according to claim 1, comprising a phase locked loop that comprises a digital phase computation circuit (12) and a phase detector (16) configured to combine a more significant part of phase data obtained from the digital phase computation circuit (12) with a less significant part of the phase data, the phase detector (16) having an phase detector output coupled to a frequency control input of the oscillator circuit (10), wherein the time to digital converter (14) is coupled to the phase detector (16) to indicate the less significant part, the control circuit (28) being configured to control a relative calibration of the less significant part and the more significant part dependent on the calibration data.

3. A circuit according to claim 2, comprising a programmable translation circuit (26) coupled between the taps and the phase detector (16), the control circuit being configured to program a translation of signals from the taps into a phase value, dependent on the calibration data.

4. A circuit according to claim 1, wherein the feed circuit (20) comprises a polarity selection circuit, configured to select a polarity of a transition in the oscillator signal that controls timing of the first active transition.

5. A circuit according to claim 1, wherein the feed circuit (20) comprises a pulse suppression circuit (40), configured to select the transition of the oscillator signal that controls timing of the first active transition after the transition at the delay circuit input and a selectable number of pulses subsequently in the oscillator signal.

6. A circuit according to claim 1, comprising a variable delay circuit coupled between the feed circuit (20) and the delay circuit input and the clock input, and configured to dither a relative delay between the signals at the delay circuit input and the clock input.

7. A method of measuring phase, the method comprising:
generating respective, differently delayed versions of a signal from a delay circuit input at taps of a delay circuit (22);
sampling data from the data inputs in response to an active transition at a clock input;
switching between a normal operating mode or a calibration mode, and, when in the normal operating mode,
feeding an oscillator signal of an oscillator circuit (10) to the delay circuit input and a reference signal to the clock input of a sampling register (24), and, when in the calibration mode,
supplying signals with transitions having timing controlled by the oscillator signal to both the delay circuit input and the clock input,
successively selecting a plurality of different transitions of the oscillator signal to control timing of a first active transition at the clock circuit after a transition at the delay circuit input; and
reading out resulting data from the sampling register for each selection the method further comprising determining calibration data for the oscillator signal from said data for the plurality of different transitions.

* * * * *